United States Patent [19]

Geannopoulos

[11] Patent Number: 5,654,656

[45] Date of Patent: Aug. 5, 1997

[54] POWER UP RESET CIRCUIT WITH THRESHOLD VOLTAGE SHIFT PROTECTION

[75] Inventor: George L. Geannopoulos, Portland, Oreg.

[73] Assignee: Intel Corporation, Santa Clara, Calif.

[21] Appl. No.: 617,960

[22] Filed: Mar. 18, 1996

[51] Int. Cl.$^6$ .................................................. H03K 17/22
[52] U.S. Cl. ........................... 327/143; 327/142; 327/198
[58] Field of Search ..................................... 327/142, 143, 327/198, 538, 530, 141, 214, 437

[56] References Cited

U.S. PATENT DOCUMENTS 5,111,067  5/1992  Wong et al. ............................. 327/143
5,523,709  6/1996  Phillips et al. ......................... 327/143

*Primary Examiner*—Timothy P. Callahan
*Assistant Examiner*—Dinh T. Le
*Attorney, Agent, or Firm*—Blakely, Sokoloff, Taylor & Zafman

[57] ABSTRACT

The reset circuit includes a first current mirror coupled to a first terminal of a power supply. A second current mirror is coupled to a second terminal of the power supply. First and second switches couple the first current mirror to the second current mirror. A threshold detector provides a first signal when a current differential between the first and second current mirrors exceeds a predetermined threshold. A first shunt shunts the first current mirror to the first terminal. A second shunt shunts the second current mirror to the second terminal. Buffering circuitry controls the first and second switches and the first and second shunts in response to the first signal. The buffering circuitry further provides a buffered reset signal from the first signal. The buffered reset signal transitions from a first level to a second level in response to the first signal. The switches and shunts reduce the biases on the threshold detector and current mirrors.

18 Claims, 4 Drawing Sheets

POWER UP RESET CIRCUIT WITH THRESHOLD VOLTAGE SHIFT PROTECTION

FIELD OF THE INVENTION

This invention relates to power up reset circuitry. In particular, this invention relates to an improved power up reset circuit for electronic circuitry.

BACKGROUND OF THE INVENTION

When power is initially applied to systems having electrical circuitry, various components of the system typically power up in an unknown state. After applying power, a reset signal may be applied to such components to reset them to a known state.

Of particular importance is when the system components should be reset. Resetting system components as soon as possible during the power up process is desirable for at least two reasons. First, to minimize time between application of power and when the system is functional, the reset should be initiated during the power up process. Second, by performing a reset before full power levels are achieved, hazardous conditions that could damage system components can be avoided.

In order to reduce the time required to bring the system up to full functionality from the time at which the power was first applied, the reset function is typically initiated during the power up process. Although the steady state output of a power supply might have a given nominal level, time is required for the steady state output levels to become available throughout the system when the power supply is first activated. Because initializing and resetting system components also takes some amount of time, the initialization and resetting process should preferably take place as soon as possible after power is initially applied to the system. This permits initialization and reset functions to execute concurrently or at least begin during the power up process. This in turn helps to minimize the total amount of time required for power up, initialization, and reset.

Failure to reset system components in a timely manner may result in catastrophic failure for the system. For example, in a computer system, buses are typically used to communicate data, address, and control information between various system components. These components usually include a bus driver to transform electrical signals from the component into voltage and current levels required for bus communication. Ideally the bus drivers operate in a tri-state mode during the power up process so that none of them are attempting to send conflicting signals on the bus. When the power is first applied, however, one bus driver may initialize to a state in which it attempts to drive one value onto the bus while a second driver is attempting to drive another value on the bus. These different values are physically represented by opposing electrical values. Thus one driver may be attempting to drive a voltage approaching available power supply levels onto the bus while another is attempting to drive the bus to a signal ground. This hazardous condition can permanently damage the bus, a component coupled to the bus, or one or more bus drivers. To avoid such an event, system components are typically reset to a known state before the power supply reaches full output levels. Thus avoiding a risk of catastrophic failure is another reason for resetting system components during the power-up process and not afterwards.

A power up reset circuit is used to provide a reset signal to system components. The system components respond by resetting themselves to a known state after receipt of the reset signal. Some components require at least some minimal power supply level so that they can be reset to a known state. This means that the reset signal will not be effective until the power supply reaches at least this minimal level. The reset signal should be provided, however, while the power available to the system is still relatively low in order to avoid hazardous conditions such as that provided in the example above. Furthermore, the reset signal should be removed at some point during the power up process so that system can proceed with any necessary initialization procedures after the reset.

FIG. 1 illustrates a block diagram for a system using a reset circuit. FIG. 2 illustrates timing and voltage relationship between VCC and a reset signal. Referring to FIG. 1 and FIG. 2, the power supply output is provided to system 100 at time 210 by closing switch 110. The power supply output transitions over a discrete period of time to the nominal operating voltage as illustrated by power supply voltage level 220. Closing switch 110 couples the power supply output to the various system components such as microprocessor 130. Switch 110 couples the power supply output to power up reset circuit 120. In one prior art power up reset circuit, the reset signal is generated upon or shortly after initial application of the power supply voltage. FIG. 2 illustrates reset signal 230 being asserted at time 212. The reset circuit is coupled to provide the reset signal to the various system components (e.g., microprocessor 130) that need it. The reset signal remains on (i.e., asserted) until the power supply has reached a predetermined level. At this predetermined level (i.e., 240), the reset circuit deasserts the reset signal. The predetermined level at which the reset signal transitions from one state to the other state is referred to as the trigger point or trip point. In accordance with goals of 1) minimizing the time required for power up, reset, and initialization; and 2) avoiding the risk of catastrophic failure; the reset signal should be asserted upon or shortly after power is turned on and the trigger point is typically set to be somewhere between the minimal power supply level required for resetting and the power supply level beyond which catastrophic failure may result.

One prior art power up reset circuit uses the threshold voltage ($V_t$) of one or more transistors in order to set or determine the trigger point level. Such a power up reset circuit is described in U.S. Pat. No. 5,111,067 of Wong, et al. One disadvantage of this prior art circuitry is that the threshold voltages can permanently shift over the course of continued power up and power down cycles such that the trigger point moves. The shifting of the trigger point can cause a reset signal to be generated too soon, too late, or even not at all. Thus decreasing the sensitivity of a power up reset circuit to shifting threshold voltages is desirable.

SUMMARY OF THE INVENTION

An improved power up reset circuit is provided. The reset circuit is designed such that the trigger point for the reset signal is substantially independent of the shifting of transistor threshold voltages which may occur over the course of a number of power up and power down cycles.

The improved power up reset circuit reduces the likelihood of a threshold voltage shift through the use of shunts and switches. The shunts and switches are used to reduce biases across critical components after the trigger point has been reached.

The reset circuit includes a first current mirror coupled to a first terminal of a power supply. A second current mirror is coupled to a second terminal of the power supply. First and second switches couple the first current mirror to the second current mirror. A threshold detector provides a first signal when a current differential between the first and second current mirrors exceeds a predetermined threshold. A first shunt shunts the first current mirror to the first terminal. A second shunt shunts the second current mirror to the second terminal. Buffering circuitry controls the first and second switches and the first and second shunts in response to the first signal. The buffering circuitry further provides a buffered reset signal from the first signal. The buffered reset signal transitions from a first level to a second level in response to the first signal.

Other objects, features, and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings, in which like references indicate similar elements and in which.

DETAILED DESCRIPTION

Figure 1:
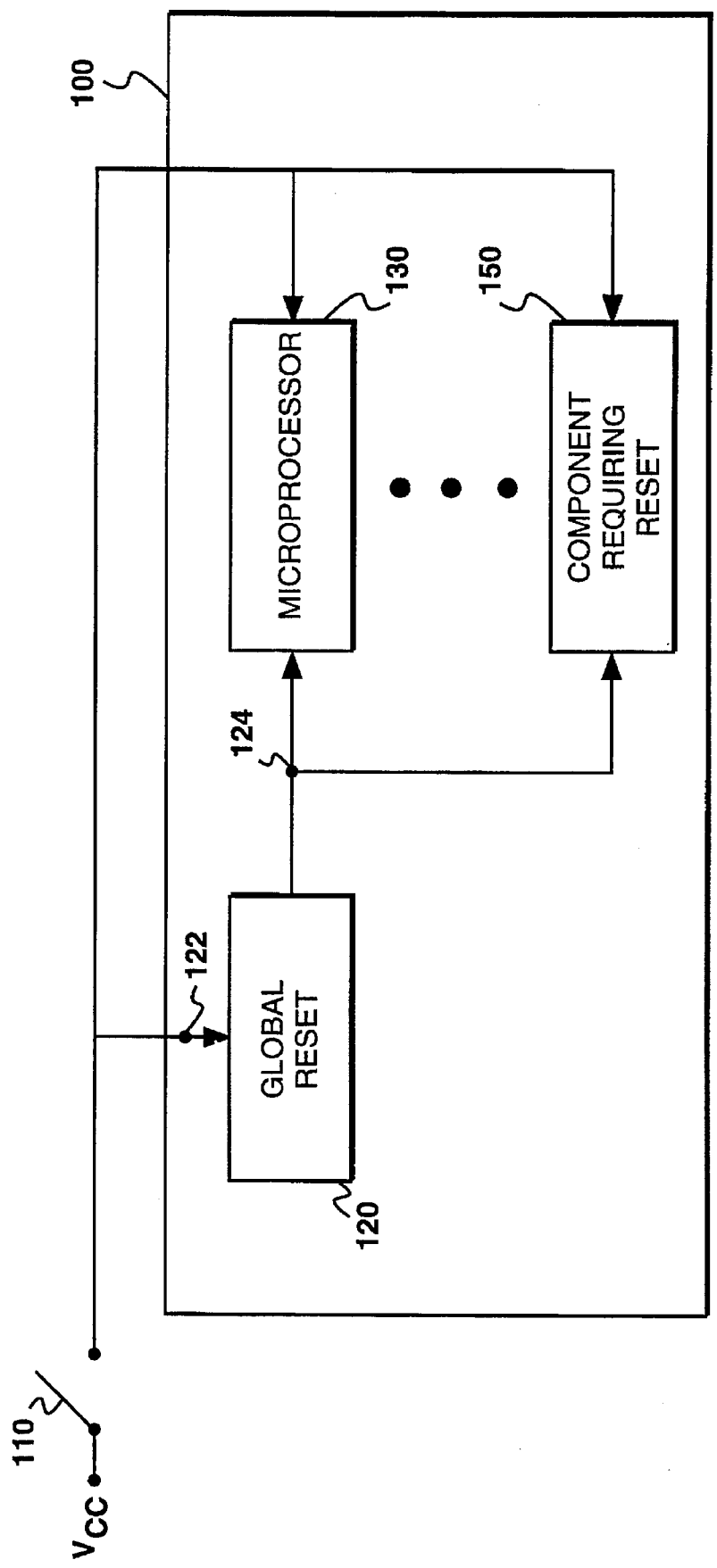
FIG. 1 illustrates a block diagram of a reset circuit and computer system components requiring a reset signal.
Figure 2:
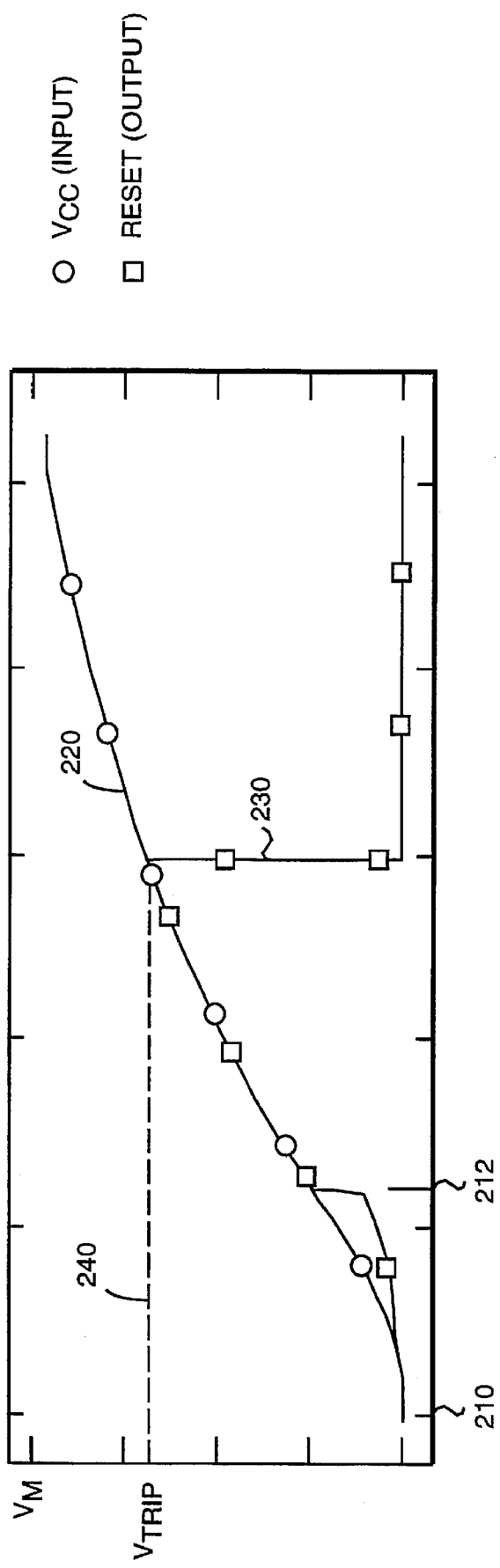
FIG. 2 illustrates one embodiment of the relationship between power supply voltage levels and a reset signal.
Figure 3:
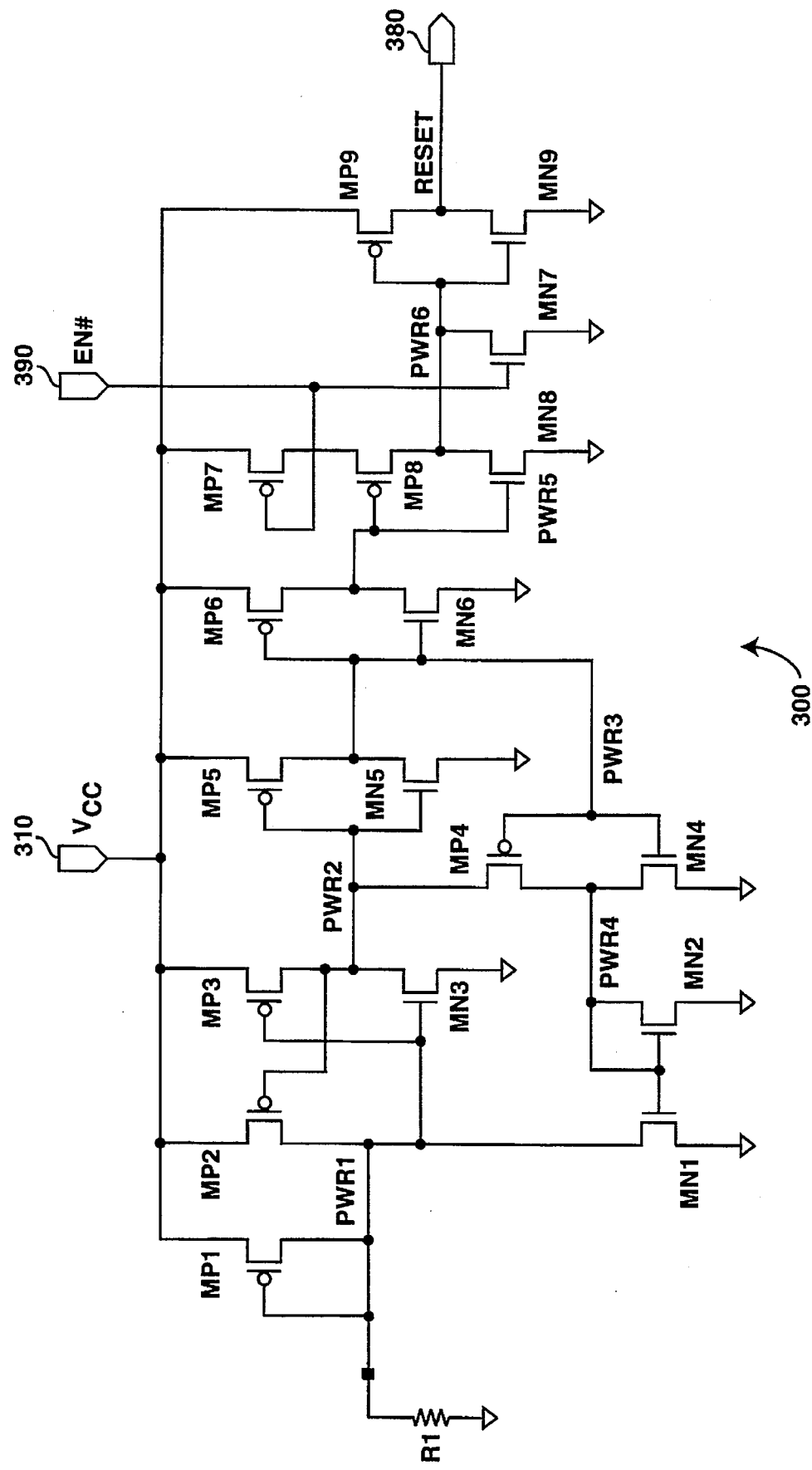
FIG. 3 illustrates a prior art power up reset circuit.
Figure 4:
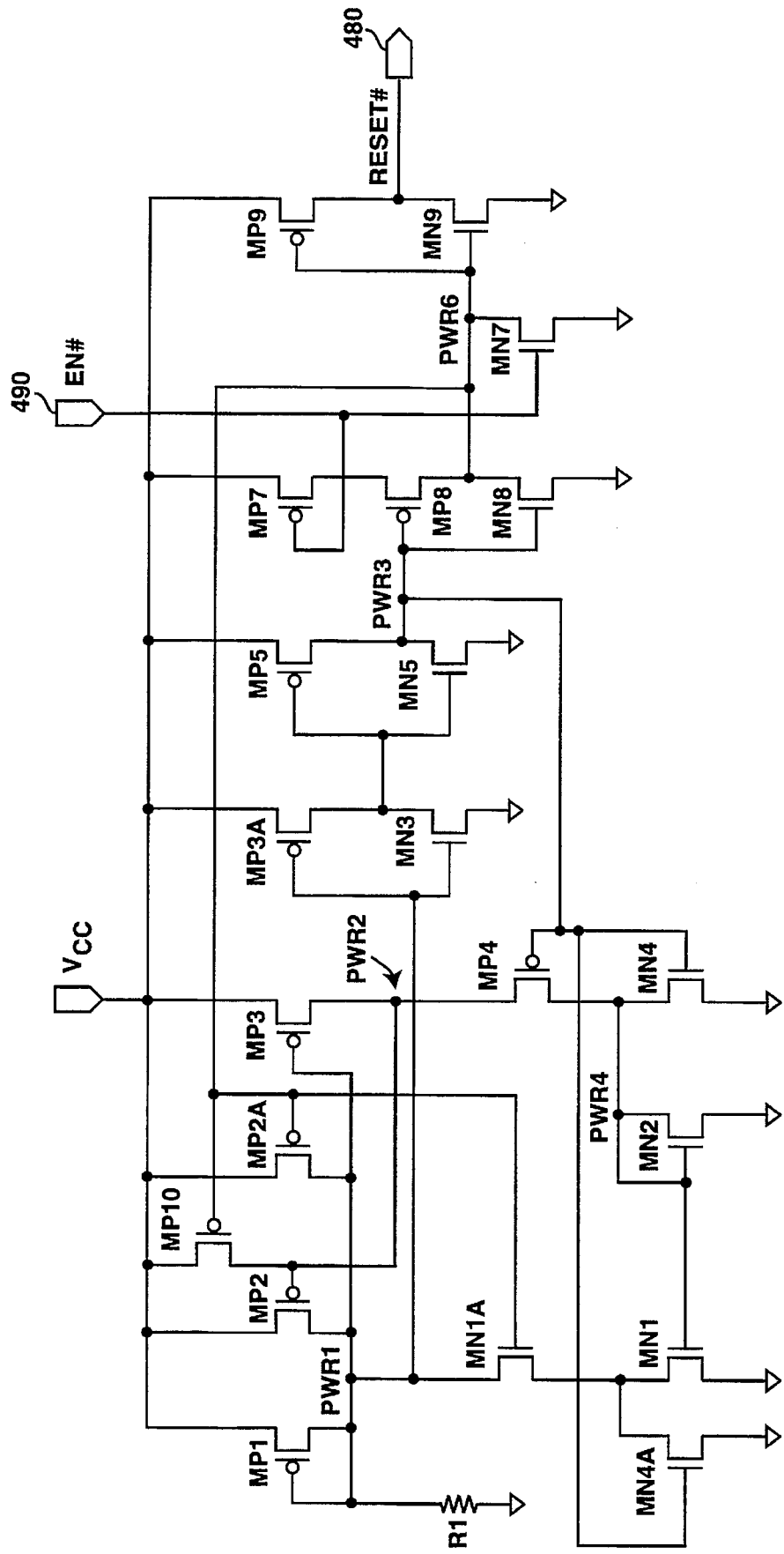
FIG. 4 illustrates an improved reset circuit with protection from threshold voltage shifts.

FIG. 3 illustrates one embodiment of reset circuit 120 as illustrated in FIG. 1. Reset circuitry 300 of FIG. 3 is described in U.S. Pat. No. 5,111,067 of Wong, et al., incorporated herein by reference. FIG. 4 illustrates an improvement of the circuitry of FIG. 3.

Referring to FIGS. 1 and 3, assume that switch 110 is open and that no power is being supplied to reset circuit 120 or to the other components. Under these circumstances, latching node PWR1 is in the powered-down state (i.e., approximately zero volts).

When power is initially applied by closing switch 110, transistors MP1 and MP3 are among the first to gradually turn on. This forces the inverter comprising transistors MP5 and MN5 to maintain the PWR3 node at approximately zero volts. The circuitry is designed so that the voltage at PWR1 remains sufficiently low so that MP1 stays on while PWR2 is sufficiently high to keep transistor MP5 off, thus maintaining PWR3 at approximately zero volts during the gradual turn on of transistors MP1 and MP3.

MP4 is on such that node PWR4 has sufficient potential to keep MN2 on. This results in a current path through transistors MP3-MP4-MN2. Because of the MP3-MP4-MN2 current path, the voltage at node PWR2 increases at a slower rate than the initial rise in supply voltage, VCC. When the difference between the supply voltage and the voltage at node PWR2 becomes large enough (as determined by circuitry design and the threshold voltage of MP2), transistor MP2 will turn on. Thus transistor MP2 is a "threshold detector" for this voltage differential. Transistor MP2 is critical for selecting the trigger or trip point of the reset circuitry.

The trigger point is determined by the threshold voltage of MP2 (i.e., $V_{tMp2}$) and the relative gain differential between the MN1 and MN2 pair and the MP1 and MP2 pair of transistors. The turning on of MP2 in turn raises node PWR1 high. Transistors MP2-MP3-MN3 become latched such that PWR2 is latched low. The rest of the circuitry serves as buffers or drivers. Once PWR2 is latched low the reset signal at output node 380 is deasserted. Up until this point the reset signal has been asserted (i.e., following VCC).

An enable control 390 is provided to permit disabling the reset circuitry. The reset circuit can provide a reset signal other than VCC only when enabled by the enable control. The reset circuitry is designed for an active low enable control. This is expressed symbolically as $\overline{EN}$ or EN# as illustrated in FIG. 3. If enable control 390 is high, transistor MN7 will turn on pulling PWR6 to ground. Furthermore, if enable control 390 is high, transistor MP7 disables inverter MP8-MN8 such the node PWR6 is unaffected by the reset of the reset circuitry. Due to the inverter formed by transistors MP9 and MN9, this means that output node 380 will reflect substantially VCC as long as the enable control signal is high independently of the rest of the circuitry. Alternatively, if a low signal is applied to enable control 390, node PWR6 will be controlled by the rest of the circuitry such that a non-VCC reset signal can be provided by output node 380.

As long as PWR1 is latched high, the latching circuit will provide a deasserted reset signal at output node 380. Resistor R1 is provided to facilitate leakage of charge from node PWR1 in the event of a power supply interruption so that the latching circuit can immediately switch from the latched state to the unlatched stated. This permits proper operation of the reset signal after power supply interruptions of short duration.

One disadvantage of this prior art circuit is that the threshold voltages of transistors MN1, MP2, and MP3 can become permanently shifted after a number of power-up and power down cycles. This shifting causes a mismatch in the current mirror comprising MP1 and MP3 and in the current mirror comprising MN1 and MN2. In other words, the drain-to-gate biases applied to these transistors can cause threshold voltage ($V_t$) shifts so that the next time the device is powered up, the trigger point occurs at a different VCC level. The trigger point tended to shift to a greater VCC level thus preventing proper low voltage operation of the system.

FIG. 4 illustrates one embodiment of the improved circuitry. In particular, transistors MN1A, MP2A, MP3A, MN4A, and MP10 have been added to help reduce the biases on transistors MN1, MP2, and MP3.

As compared with FIG. 3, the MP6-MN6 inverter has been removed so that the RESET signal is now $\overline{RESET}$ when referenced to the prior art circuit of FIG. 3. ($\overline{RESET}$ is shown as RESET# in FIG. 4). As stated previously, the MP6-MN6 inverter served primarily as a buffer or driver which may or may not be necessary depending upon what the output requirements are on the reset circuitry. Because the MP6-MN6 inverter has been removed in this embodiment, the output of the reset circuit actually transitions to a high level (approaching VCC) once the trigger point is reached.

As with the prior art circuit, when VCC reaches the trigger point, node PWR1 transitions from a low state to a high state. The level at PWR1 is inverted by inverter MP3A-MN3 and again by inverter MP5-MN5 so that node PWR3 is also high. Assuming that the reset signal is enabled (EN# 490 is low), node PWR3 is inverted by inverter MP8-MN8 such that node PWR6 transitions to a low level. Node PWR6 is inverted by inverter MP9-MN9 such that the RESET# signal transitions from a low level to VCC once VCC reaches the trigger point.

In one embodiment, the reset circuitry is implemented with field effect transistors using complementary metal oxide semiconductor (CMOS) technology. Functionally, MP1 and MP3 act as a PMOS (i.e., P-type MOS) current mirror (the upper current mirror). MN1 and MN2 serve as an NMOS (i.e., N-type) current mirror (the lower current mirror). Transistor MP2 serves as the threshold detector and determines when the current differential between the upper and lower current mirrors exceeds a predetermined level (corresponding to the VCC trigger point). Inverters MP3A-MN3, MP5-MN5, MP8-MN8, and MP9-MN9 serve primarily as buffers or drivers. The number of buffer or driver stages may vary dependent upon the reset signal output requirements. The only constraint on the number and placement of inverters is that node PWR3 must follow node PWR1 and node PWR6 must be the logical complement of PWR3 so that the appropriate control signals are provided to switches MN1A, MP4, MP2A, and MP10.

Switches are used to reduce the biases which can lead to shifted threshold voltages on components critical to determining the trigger 5 point. After the reset signal is latched, the switches decouple the upper current mirror circuitry from the lower current mirror circuitry. The bias across transistors comprising the upper current mirror is reduced by shunting the upper current mirror to VCC. The bias across transistors comprising the lower current mirror is reduced by shunting the lower current mirror to ground.

Transistors MN1A and MP4 serve as switches to decouple the upper current mirror from the lower current mirror. In particular, MN1A and MP4 decouple the drains of MN1 and MN2 from approximately VCC. After the reset signal is latched node PWR6 is at a low level and nodes PWR1 and PWR3 are at a high level. Node PWR6 is coupled to the gate of MN1A, so that the drain of MN1A is decoupled from node PWR1 after the reset signal is latched. The high level at node PWR3 is applied to the gate of MP4, so that the drain of MN2 is decoupled from VCC after the reset signal is latched. Thus once the trigger point is reached, switches MN1A and MP4 decouple the lower current mirror from the upper current mirror.

Transistors MN4A and MN4 serve as switches to shunt the lower current mirror to ground after the reset signal is latched so that there is substantially no bias across the lower current mirror. Now that the reset circuit is providing the latched reset signal, node PWR6 is low and node PWR3 is high. Transistor MN4A is controlled by node PWR3 to shunt the drain of MN1 to ground when the reset signal is latched. Transistor MN4 is controlled by node PWR3 to shunt the drain of MN2 to ground when the reset signal is latched. Thus MN4 and MN4A collectively serve as shunting circuitry for the lower current mirror. The lower current mirror is shunted to ground to reduce the bias across the transistors comprising the lower current mirror. This reduction in bias, in turn, substantially reduces the likelihood of a threshold voltage shift for the components of the lower current mirror.

With respect to the upper current mirror, transistors MP2A and MP10 serve as shunt circuitry to reduce potentially harmful biases. In particular, node PWR6 controls MP10 to shunt the gate of MP2 and the drain of MP3 to VCC once the reset signal latches. This substantially reduces the bias across MP2 and MP3. Assuming node PWR1 is approaching VCC, the drain, gate, and source of transistors MP2 and MP3 are exposed to approximately the same potential. Thus any bias across transistors MP2 and MP3 has been substantially reduced. The reduction in bias helps to eliminate shifting of the threshold voltages of transistor MP3 and threshold detector MP2. This in turn helps to improve the stability of the trigger point after numerous power-up cycles.

Transistor MP2A helps to keep PWR1 high once the reset signal is latched. Because node PWR6 is low, MP2A will short PWR1 to VCC. MP2A may suffer from the threshold voltage shifting described above due to the bias across it. MP2A, however, is intended to be a "sacrificial" device. MP2A is serving only as a switch or shunt instead of as part of the current mirror circuitry for the latch. Thus the threshold voltage of MP2A is not critical to the trigger point determination.

In one embodiment this power up reset circuit is integrated within a microprocessor to provide the reset signal to the various components of the microprocessor and/or system components external to the microprocessor. In another embodiment the power up reset circuit is external to the microprocessor.

In the preceding detailed description, the invention is described with reference to specific exemplary embodiments thereof. Various modifications and changes may be made thereto without departing from the broader spirit and scope of the invention as set forth in the claims. The specification and drawings are, accordingly, to be regarded in an illustrative rather than a restrictive sense.

What is claimed is:

1. A reset circuit comprising:
    a first current mirror;
    a second current mirror;
    a threshold detector coupled to provide a first signal in response to a detected current differential between the first and second current mirrors;
    a first shunt coupled to shunt the first current mirror in accordance with the first signal such that a first current mirror bias is substantially zero; and
    a second shunt coupled to shunt the second current mirror in accordance with the first signal such that a second current mirror bias is substantially zero.

2. The reset circuit of claim 1 wherein the first shunt includes circuitry to shunt the threshold detector such that a threshold detector bias is substantially zero.

3. The reset circuit of claim 1 further comprising:
    a first switch to couple the first current mirror to the second current mirror in accordance with the first signal; and
    a second switch to couple the first current mirror to the second current mirror in accordance with the first signal.

4. The reset circuit of claim 3 further comprising:
    buffering circuitry providing a buffered reset signal from the first signal, the buffering circuitry controlling the first and second switches and the first and second shunts in response to the first signal, the buffered reset signal transitioning from a first level to a second level in response to the first signal.

5. A reset circuit comprising:
    a first current mirror coupled to a first terminal of a direct current power supply;
    a second current mirror coupled to a second terminal of the direct current power supply;
    a first switch to couple the first current mirror to the second current mirror;
    a second switch to couple the first current mirror to the second current mirror;
    a threshold detector, wherein the threshold detector provides a first signal when a current differential between the first and second current mirrors exceeds a predetermined threshold;

a first shunt to shunt the first current mirror to the first terminal;

a second shunt to shunt the second current mirror to the second terminal; and buffering circuitry providing a buffered reset signal from the first signal, the buffering circuitry controlling the first and second switches and the first and second shunts in response to the first signal, the buffered reset signal transitioning from a first level to a second level in response to the first signal.

6. The reset circuit of claim 5 where in the first shunt includes circuitry to shunt the threshold detector such that a threshold detector bias is substantially zero.

7. The reset circuit of claim 5 wherein the buffering circuitry includes at least one inverter.

8. The reset circuit of claim 5 wherein the buffering circuitry includes an enable control such that the buffered reset signal transitions from the first level to the second level only if the enable control is enabled.

9. The reset circuit of claim 5 implemented in complementary metal oxide semiconductor (CMOS) technology.

10. The reset circuit of claim 5 wherein the first and second shunts comprise field effect transistors.

11. The reset circuit of claim 5 wherein the first and second current mirrors comprise field effect transistors.

12. A system comprising:

at least one component requiring a reset signal;

a reset coupled to the component, circuit comprising:
  a first current mirror coupled to a first terminal of a power supply;
  a second current mirror coupled to a second terminal of the direct current power supply;
  a first switch to couple the first current mirror to the second current mirror;
  a second switch to couple the first current mirror to the second current mirror;
  a threshold detector, wherein the threshold detector provides a first signal when a current differential between the first and second current mirrors exceeds a predetermined threshold;
  buffering circuitry providing a buffered reset signal to the at least one component, the buffered reset signal generated from the first signal, the buffering circuitry controlling the first and second switches to decouple the first and second current mirrors in response to the first signal, the reset signal buffered transitioning from a first level to a second level in response to the first signal;
  a first shunt controlled by the buffering circuitry to shunt the second current mirror to the second terminal in response to the first signal; and
  a second shunt controlled by the buffering circuitry to shunt the first current mirror to the first terminal in response to the first signal.

13. The reset circuit of claim 12 where in the first shunt includes circuitry to shunt the threshold detector such that a threshold detector bias is substantially zero.

14. The system of claim 12 wherein the buffering circuitry includes at least one inverter.

15. The system of claim 12 wherein the buffering circuitry includes an enable control such that the reset signal transitions from the first level to the second level only if the enable control is enabled.

16. The system of claim 12, implemented in complementary metal oxide semiconductor (CMOS) technology.

17. The system of claim 12, wherein the first and second shunts comprise field effect transistors.

18. The system of claim 12 wherein the first and second current mirrors comprise field effect transistors.

* * * * *